United States Patent
Goldblatt

(10) Patent No.: US 9,263,990 B2
(45) Date of Patent: Feb. 16, 2016

(54) IMPEDANCE TRANSFORMER FOR USE WITH A QUADRATURE PASSIVE CMOS MIXER

(71) Applicant: QUALCOMM Incorporated, San Diego, CA (US)

(72) Inventor: Jeremy Mark Goldblatt, Encinitas, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/899,108

(22) Filed: May 21, 2013

(65) Prior Publication Data

US 2014/0347117 A1 Nov. 27, 2014

(51) Int. Cl.
*G06G 7/12* (2006.01)
*H03D 7/14* (2006.01)
*H04B 1/04* (2006.01)
*H03D 7/16* (2006.01)

(52) U.S. Cl.
CPC ............ *H03D 7/1491* (2013.01); *H03D 7/1466* (2013.01); *H03D 7/1483* (2013.01); *H03D 7/165* (2013.01); *H04B 1/04* (2013.01)

(58) Field of Classification Search
CPC .............. H03D 2200/0019; H03D 2200/0021; H03D 2200/0023
USPC .................................. 327/355–359; 455/326
See application file for complete search history.

(56) References Cited

U.S. PATENT DOCUMENTS

| | | | |
|---|---|---|---|
| 4,079,415 A | 3/1978 | Will | |
| 5,428,839 A * | 6/1995 | Friesen et al. | 455/326 |
| 6,587,678 B1 * | 7/2003 | Molnar et al. | 455/323 |
| 7,457,606 B2 * | 11/2008 | Kim | 455/323 |
| 7,580,693 B2 * | 8/2009 | Rohde et al. | 455/326 |
| 7,826,816 B2 | 11/2010 | Zhuo et al. | |
| 7,844,241 B2 * | 11/2010 | Kintis et al. | 455/323 |
| 7,851,947 B2 * | 12/2010 | Cassia et al. | 307/113 |
| 7,880,557 B2 * | 2/2011 | Jiang | 333/26 |
| 7,904,036 B2 * | 3/2011 | Mattisson et al. | 455/118 |
| 7,933,576 B2 * | 4/2011 | Ji et al. | 455/323 |
| 8,044,723 B2 * | 10/2011 | Kim et al. | 331/17 |
| 8,095,082 B2 * | 1/2012 | Deng et al. | 455/91 |
| 8,131,248 B2 * | 3/2012 | Kumar | 455/318 |
| 8,301,101 B2 * | 10/2012 | Mirzaei et al. | 455/293 |
| 8,498,604 B2 * | 7/2013 | Jiang et al. | 455/326 |
| 8,897,726 B2 * | 11/2014 | Kim et al. | 455/115.1 |

(Continued)

OTHER PUBLICATIONS

Mirzaei, et al., "Analysis of Direct-Conversion IQ Transmitters With 25% Duty-Cycle Passive Mixers," IEEE Transactions on Circuits and Systems-I: Regular Papers, vol. 58, No. 10, Oct. 2011, pp. 2318-2331.

(Continued)

*Primary Examiner* — Kenneth B Wells
(74) *Attorney, Agent, or Firm* — Toler Law Group, PC

(57) ABSTRACT

An impedance transformer for use with a quadrature passive mixer is disclosed. In an exemplary embodiment, an apparatus includes a mixer configured to generate an up-converted signal at a mixer output port in response to local oscillator (LO) signals, and an impedance transformer configured to provide a complex impedance at the mixer output port. The complex impedance configured to generate a selected level of the reverse isolation for the mixer thereby generating a selected amplitude flatness symmetry characteristic for the up-converted signal.

13 Claims, 6 Drawing Sheets

(56) References Cited

U.S. PATENT DOCUMENTS

| | | |
|---|---|---|
| 2009/0270062 A1* | 10/2009 | Mu et al. .................. 455/323 |
| 2010/0120369 A1 | 5/2010 | Ko et al. |
| 2011/0207420 A1 | 8/2011 | Rajendran et al. |
| 2012/0252374 A1 | 10/2012 | Mattisson et al. |
| 2012/0256676 A1 | 10/2012 | Bellaouar et al. |

OTHER PUBLICATIONS

Brenna G et al: "A 2GHz Carrier Leakage Calibrated Direct-Conversion WCDMA Transmitter in 0.13 um CMOS" IEEE Journal of Solid-State Circuits, IEEE vol. 39, No. 8, Aug. 1, 2004, pp. 1253-1262, XP011115212.

Dsouza S., et al., "A progammable baseband anti-alias filter for a passive-mixer-based, SAW-less, multi-band, multi-mode WEDGE transmitter", Circuits and Systems (ISCAS), 2011 IEEE International Symposium on, IEEE, May 15, 2011, pp. 450-453, XP031997665, DOI:10.1109/ISCAS.2011.5937599 ISBN: 978-1-4244-9473-6.

Huang Y., et al., "A High-Linearity WCDMA/GSM Reconfigurable Transceiver in 0.13-um CMOS", IEEE Transactions on Microwave Theory and Techniques, IEEE Service Center, Piscataway, NJ, US, vol. 61, No. 1, Jan. 1, 2013, pp. 204-217, XP011488054, ISSN: 0018-9480, DOI:10.1109/TMTT.2012.2222913.

International Search Report and Written Opinion for International Application No. PCT/US2014/037301, ISA/EPO, Date of Mailing Jul. 7, 2014, 13 pages.

Lee K-Y., et al., "Full-CMOS 2-GHz WCDMA Direct Conversion Transmitter and Receiver", IEEE Journal of Solid-State Circuits, IEEE Service Center, Piscataway, NJ, USA, vol. 38, No. 1, Jan. 1, 2003, XP011065923, ISSN: 0018-9200.

Meng C.C., et al.,"A fully integrated 5.2GHz GaInP/GaAs HBT upconversion micromixer with output LC current combiner and oscillator" 2003 IEEE MTT-S International Microwave Symposium Digest. (IMS 2003). Philadelphia, PA, June 8-13, 2003; [IEEE MTT-S International Microwave Symposium], New York, NY: IEEE, US, Jun. 8, 2003, pp. A205-A208, XP032412520, DOI: 10.1109/MWSYM.2003.1211070 ISBN: 978-0-7803-7695-3.

Mirzaei A., et al., "Architectural Evolution of Integrated M-Phase High-Q Bandpass Filters", IEEE Transactions on Circuits and Systems I: Regular Papers, IEEE, US, vol. 59, No. 1, Jan. 1, 2012, pp. 52-65, XP011391855, ISSN: 1549-8328, DOI: 10.1109/TCSI.2011.2161370.

* cited by examiner

IMPEDANCE TRANSFORMER FOR USE WITH A QUADRATURE PASSIVE CMOS MIXER

BACKGROUND

1. Field

The present application relates generally to the operation and design of analog front ends, and more particularly, to the operation and design of direct conversion transmitters that utilize passive mixers.

2. Background

Direct conversion transmitters typically use active mixers to up-convert baseband signals to radio frequencies (RF). Active mixers provide high conversion gains and excellent isolation between the mixer's input and output ports. However, active mixers typically require large power supplies and may have problems with noise performance.

Passive mixers address some of the problems exhibited by active mixers. For example, passive mixers can operate with smaller power supplies and exhibit better noise performance than active mixers. However, passive mixers typically do not provide the same reverse isolation as active mixers. Thus, passive mixers are generally not used in direct conversion transmitters due to the interaction of the complex impedances on the mixer's baseband and RF ports, which may affect the amplitude flatness symmetry across the transmission band.

Therefore, it would be desirable to have a way to utilize a passive mixer in a direct conversion transmitter that overcomes the problems associated with reverse isolation described above.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
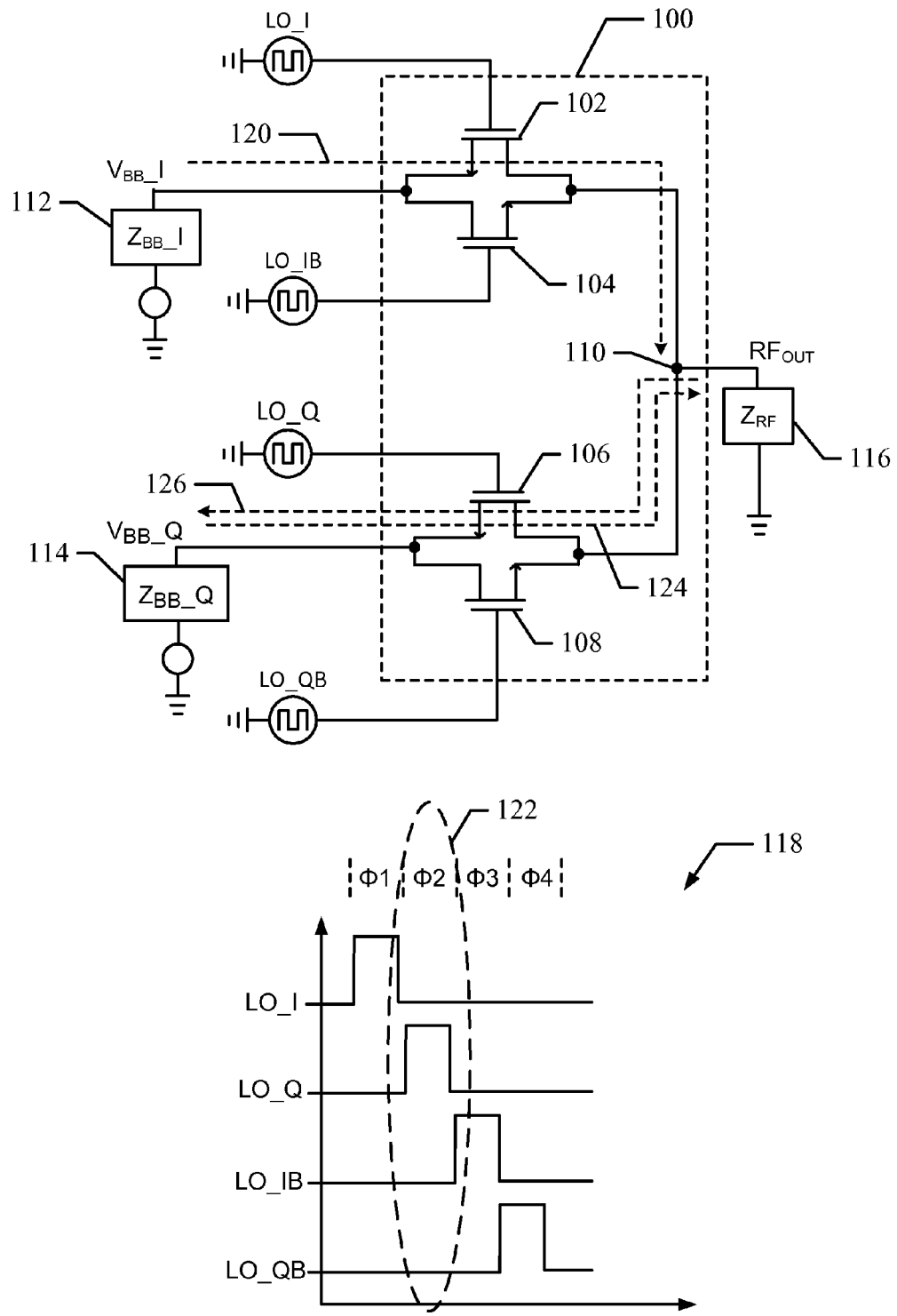
FIG. 1 shows a conventional quadrature CMOS passive mixer for use in a transmitter.

FIG. 1 shows a conventional quadrature CMOS passive mixer 100 for use in a transmitter. The mixer 100 comprises CMOS switches 102, 104, which process an in-phase baseband signal ($V_{BB\_I}$). The mixer 100 also comprises CMOS switches 106, 108, which process a quadrature phase (Q) baseband signal ($V_{BB\_Q}$). The CMOS switches 102, 104, 106 and 108 are controlled by local oscillator (LO) clock signals (LO_I, LO_Q, LO_IB, and LO_QB) to generate an RF output signal ($RF_{OUT}$) at output terminal (or port) 110. On the baseband side of the mixer 100, complex impedances $Z_{BB\_I}$ 112 and $Z_{BB\_Q}$ 114 are presented to the inputs of the mixer 100. On the RF side of the mixer 100, the complex impedance $Z_{RF}$ 116 is presented to the RF output port 110 of the mixer 100.

A timing diagram 118 shows the LO signals in detail. Each of the LO signals have a low level (inactive) and a high level (active). When an LO signal is at a high level, the CMOS switch it is connected to is "turned on", and when at a low level, the CMOS switch is "turned off" Thus, four phases ($\Phi1$, $\Phi2$, $\Phi3$, $\Phi4$) of the LO signals can be defined, where in each phase only one of the LO signals is active (at a high level).

Typically, the mixer 100 provides poor reverse isolation since a series of sequential clock events (i.e., LO phases) may degrade the desired isolation of the baseband I and Q signals from the RF output. As an example, it will be assumed that the baseband signal ($V_{BB\_I}$) is converted to an RF signal that appears at the RF output terminal 110 during in-phase clocking (phase $\Phi1$) of the LO signals, as shown by path 120. If this RF signal is present during the next or adjacent "quadrature" clock phase (phase $\Phi2$ indicated at 122), there is an opportunity for this RF signal to return to the "quadrature" baseband input through the CMOS switch 106 during the phase $\Phi2$ "quadrature" clock. For example, during phase $\Phi2$ of the LO clock signals, the Q baseband signal passes through transistor 106 to the RF output terminal 110 as shown by path 124. Any RF signal at terminal 110 that remains from the previous in-phase clock (phase $\Phi1$) can now pass back through the CMOS transistor 106 to the baseband impedance $Z_{BB\_Q}$ 114, as shown by path 126. The flow of RF signals stored at the RF output terminal 110 back through the switches of the mixer 100 may repeat through multiple LO phases until the original baseband signals degrade to the point where they are indistinguishable from thermal noise.

For signals to be present at the RF port of the mixer 100 at the start of a clock phase, the impedance $Z_{RF}$ 116 presented to the mixer needs to store energy over a duration that is longer than the on-state of the previous clock phase. This can occur when the complex RF impedance ($Z_{RF}$) has a large imaginary impedance component relative to its real impedance component.

The imaginary impedance component of the baseband impedance ($Z_{BB}$) will act similarly to that of the RF imaginary impedance component as it will store signals from previous LO clock phases and add this stored contribution or "signal persistence" to the baseband signals in future LO phases.

The imaginary portion of the RF impedance ($Z_{RF}$) and the magnitude of the imaginary component relative to the real impedance (i.e., a resistor) are related to the amount and the duration of the energy storage. The stored energy can be in the form of a current and/or a voltage. Since the passive CMOS switch of the mixer 100 that is enabled during an on-state LO phase is little more than a resistor connecting the RF and baseband ports, the signal can flow through the switch when the voltage potential present on one side is greater than the other.

As a result of the poor reverse isolation performance of the mixer 100, the RF output may experience degraded amplitude flatness symmetry. As discussed in further detail below, exemplary embodiments of a quadrature CMOS passive transmit mixer are disclosed that overcome the problems associated with reverse isolation that are present in conventional mixers like the mixer 100 shown in FIG. 1.

Figure 2:
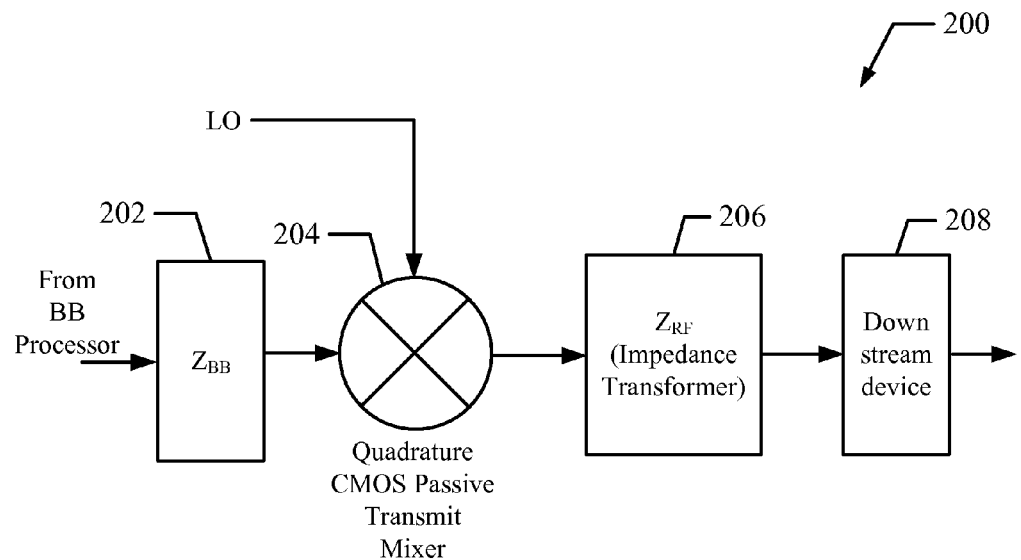
FIG. 2 shows an exemplary embodiment of a direct conversion transmitter front end suitable for use in a wireless device.

FIG. 2 shows an exemplary embodiment of a direct conversion transmitter front end 200 suitable for use in a wireless device. The front end 200 comprises an exemplary embodiment of a quadrature CMOS passive transmit mixer 204, a baseband impedance ($Z_{BB}$) 202 presented to a baseband port of the mixer 204, an RF impedance ($Z_{RF}$) 206 presented to an RF port of the mixer 204, and a downstream device 208. The RF impedance 206 is also referred to herein as an "impedance transformer". The downstream device 208 is a downstream device in the transmit chain, such as a buffer, isolation stage, driver amplifier or other transmit chain device.

The quadrature CMOS passive transmit mixer 204 is constructed the same as the mixer 100 shown in FIG. 1 and operates to receive a baseband signal from a baseband processor and up-converts this signal using LO signals to generate RF signals for transmission. For example, the LO signals may be the LO signals (LO_I, LO_Q, LO_IB and LO_QB) shown in FIG. 1 that have the timing relationships as shown in the diagram 118. In various exemplary embodiments, the mixer 100 is configured as a passive mixer having switches that conduct when enabled and provide a substantially open circuit when disabled. Furthermore, the switches utilized in the mixer 100 comprise MOS switches (such as CMOS, NMOS, or PMOS switches), but may also comprise field effect transistor (FET) switches, such as JFET or GaAs FET switches.

Impedance Transformer Increases Isolation and Provides Gain

In various exemplary embodiments, the impedance transformer 206 is configured to increase or generate a selected level of reverse isolation for the mixer 204 and to provide gain. For example, the impedance transformer 206 presents the RF port of the mixer 204 with a complex impedance that is configured to control the amount of signal energy stored at the mixer's RF output port between LO phases thereby increasing the reverse isolation of the mixer 204. Furthermore, the impedance transformer 206 transforms the impedance at the RF port from low to high and thus provides a voltage gain. Utilizing just a resistor will not provide such a gain, and if a resistor were to be used, the gain would have to be adjusted with an additional active stage thus degrading signal to noise performance.

In an exemplary embodiment, the impedance transformer 206 is configured to reduce or eliminate the signal energy stored during an LO clock phase so that this energy will not flow back through the CMOS switches of the mixer 204 to the baseband side during a subsequent LO clock phase. For example, the real and imaginary parts of the RF impedance ($Z_{RF}$) are configured to reduce, eliminate and/or control the amount of stored energy at the RF port that can flow back through the mixer 204 during a subsequent LO clock phase.

Therefore, in various exemplary embodiments, the impedance transformer 206 is configured to set the complex impedance of the RF side of the mixer 204 to generate a selected level of reverse isolation and thereby generate a selected amplitude flatness symmetry characteristic across a selected transmission band.

Figure 3:
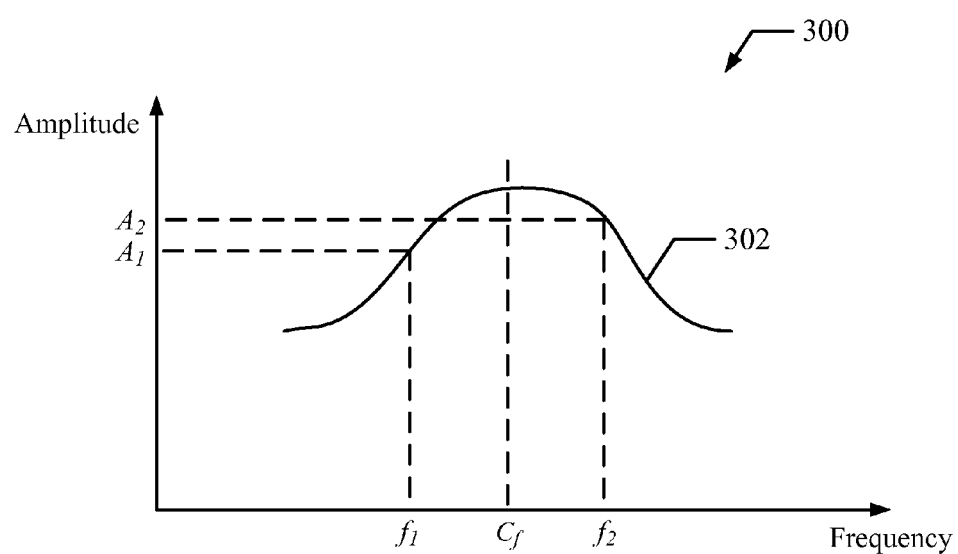
FIG. 3 shows an exemplary graph showing a plot of an RF signal that illustrates an amplitude flatness symmetry characteristic.

FIG. 3 shows an exemplary graph 300 showing a plot 302 of an RF signal that illustrates an amplitude flatness symmetry characteristic. The graph 300 has a vertical axis representing amplitude and a horizontal axis representing frequency. The graph 300 can be used to determine an amplitude flatness symmetry characteristic of the RF output of a mixer over a selected frequency range. The selected frequency range is defined as the frequency range between frequencies ($f_1$ and $f_3$), which has a center frequency ($C_f$).

Amplitude flatness symmetry is defined as the amplitude variation across equal distant but opposite frequency offsets from the center of a selected frequency range. As illustrated in the graph 300, the amplitude flatness symmetry characteristic of the RF signal is determined by the change in amplitude ($A_2-A_1$) that occurs over the selected frequency range defined by $f_1$ and $f_2$. In various exemplary embodiments, the impedance transformer 206 is configured to present a complex impedance to the RF port of the mixer 204 that improves reverse isolation and provides a selected amplitude flatness symmetry characteristic.

Figure 4:
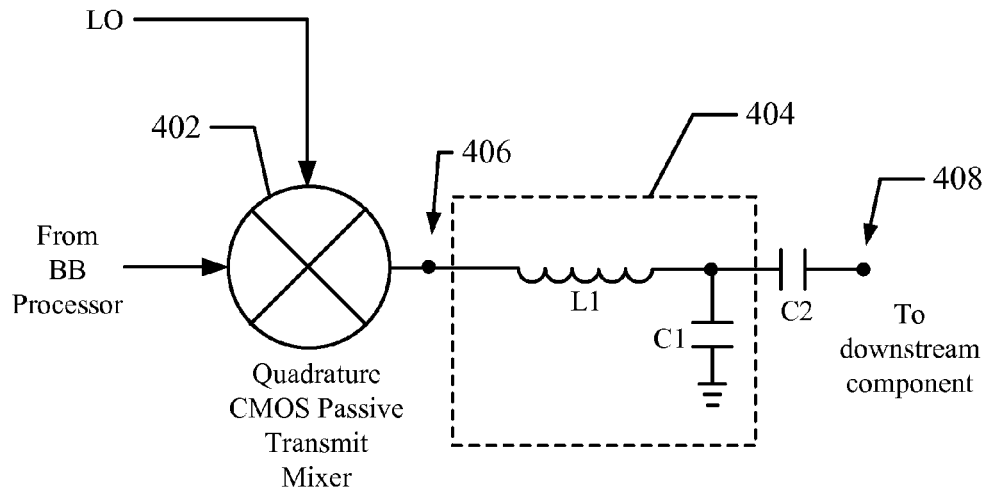
FIG. 4 shows an exemplary detailed embodiment of a quadrature CMOS passive transmit mixer and impedance transformer.

FIG. 4 shows an exemplary detailed embodiment of a quadrature CMOS passive transmit mixer 402 and impedance transformer 404. For example, the mixer 402 and impedance transformer 404 are suitable for use as the mixer 204 and impedance transformer 206 shown in FIG. 2. In this exemplary embodiment, the mixer 402 provides a single ended output.

The impedance transformer 404 comprises input terminal 406 that receives the single ended output of the passive mixer 402. The impedance transformer 404 is coupled to an output port 408 that produces output signals that are input to downstream components of a transmitter chain, for example, the downstream component 208 shown in FIG. 2.

In an exemplary embodiment, the impedance transformer 404 comprises a first inductor (L1) connected to the terminal 406 and a capacitor (C1) connected between the inductor L1 and a signal ground. A first terminal of capacitor C2 is connected to the inductor L1 and the capacitor C1. A second terminal of the capacitor C2 forms the output port 408. Thus, in this exemplary embodiment, the impedance transformer 404 comprises a series L-C configuration.

The impedance transformer 404 operates to set the complex impedance presented to the RF side of the mixer 402 to increase or generate a selected level of reverse isolation and reduce or eliminate the availability of stored energy that may flow back through the mixer 402 to the baseband side. By setting the selected level of reverse isolation of the mixer 402, a selected amplitude flatness symmetry characteristic across a selected transmission band can be achieved.

Figure 5:
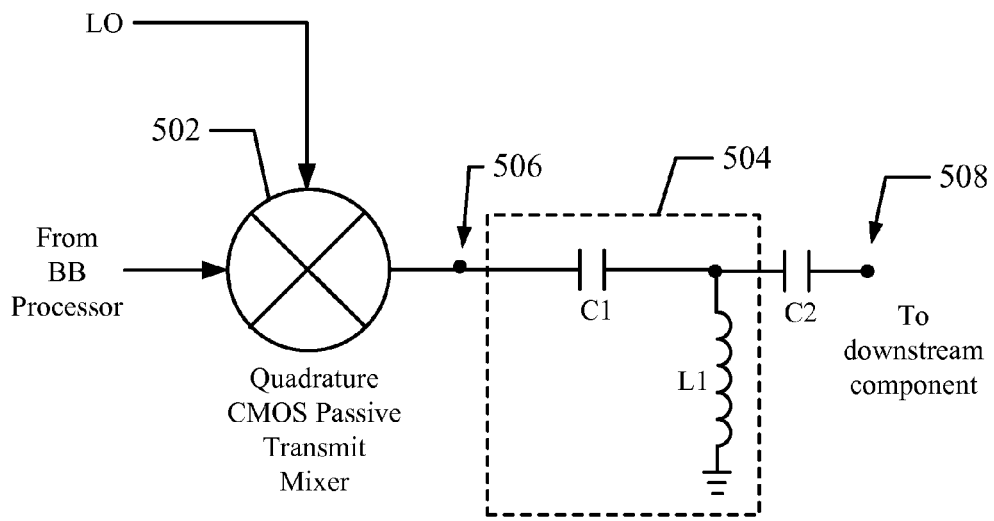
FIG. 5 shows an exemplary detailed embodiment of a quadrature CMOS passive transmit mixer and impedance transformer.

FIG. 5 shows an exemplary detailed embodiment of a quadrature CMOS passive transmit mixer 502 and impedance transformer 504. For example, the mixer 502 and impedance transformer 504 are suitable for use as the mixer 204 and impedance transformer 206 shown in FIG. 2. In this exemplary embodiment, the mixer 502 provides a single ended output.

The impedance transformer 504 comprises input terminal 506 that receives a single ended output of the passive mixer 502. The impedance transformer 504 is coupled to an output port 508 that produces output signals that are input to downstream components of a transmitter chain, for example, the downstream component 208 shown in FIG. 2.

In an exemplary embodiment, the impedance transformer 504 comprises a first capacitor (C1) connected to the terminal 506 and an inductor (L1) connected between the capacitor C1 and a signal ground. A first terminal of capacitor C2 is connected to the inductor L1 and the capacitor C1. A second terminal of the capacitor C2 forms the output port 508. Thus, in this exemplary embodiment, the impedance transformer 504 comprises a series C-L configuration.

The impedance transformer 504 operates to set the complex impedance presented to the RF side of the mixer 502 to increase or generate a selected level of reverse isolation and reduce or eliminate the availability of stored energy that may flow back through the mixer 502 to the baseband side. By setting the selected level of reverse isolation of the mixer 502, a selected amplitude flatness symmetry characteristic across a selected transmission band can be achieved.

Figure 6:
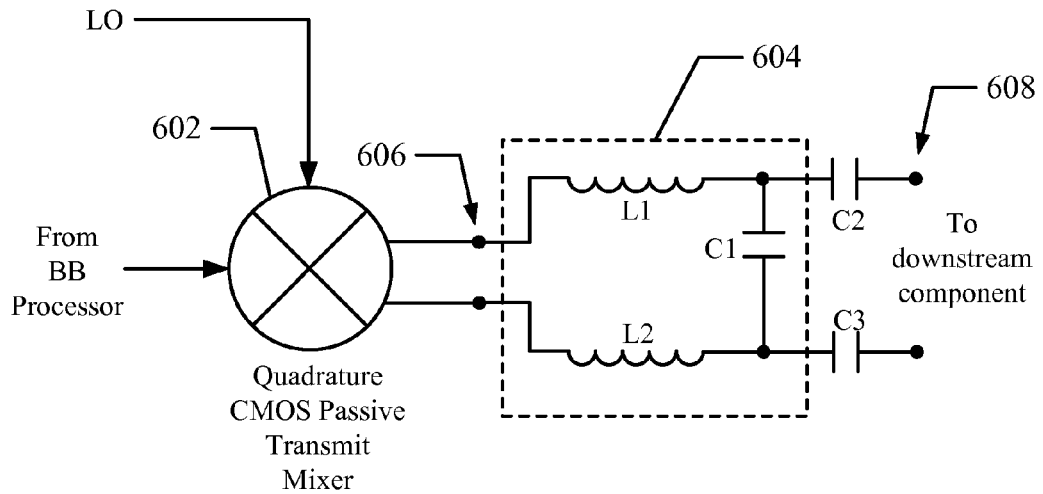
FIG. 6 shows an exemplary detailed embodiment of a quadrature CMOS passive transmit mixer and impedance transformer.

FIG. 6 shows an exemplary detailed embodiment of a quadrature CMOS passive transmit mixer 602 and impedance transformer 604. For example, the mixer 602 and impedance transformer 604 are suitable for use as the mixer 206 and impedance transformer 206 shown in FIG. 2. In this exemplary embodiment, the mixer 602 provides a differential output.

The impedance transformer 604 comprises input terminals 606 that receive a differential output of the passive mixer 602. The impedance transformer 604 is coupled to an output port 608 that outputs signals that are input to downstream components of a transmitter chain, for example, the downstream component 208 shown in FIG. 2.

In an exemplary embodiment, the impedance transformer 604 comprises a first inductor (L1), a capacitor (C1), and a second inductor (L2) connected in series across the input terminals 606. A capacitor C2 is connected to a first terminal of the capacitor C1, and a capacitor C3 is connected to a second terminal of the capacitor C1. The output port 608 is provided between the secondary terminals of capacitors C2 and C3. Thus, in this embodiment, the impedance transformer 604 comprises a series L-C-L configuration. In an exemplary alternate embodiment, the inductor L2 is omitted and replaced with a short circuit.

The impedance transformer 604 operates to set the complex impedance presented to the RF side of the mixer 602 to increase or generate a selected level of reverse isolation and reduce or eliminate the availability of stored energy that may flow back through the mixer 602 to the baseband side. By setting the selected level of reverse isolation of the mixer 602, a selected amplitude flatness symmetry characteristic across a selected transmission band can be achieved.

Figure 7:
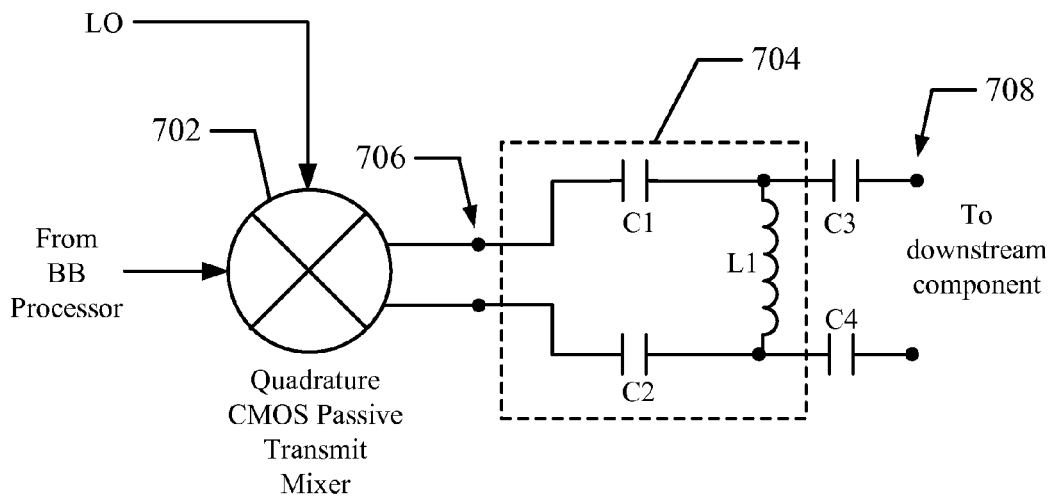
FIG. 7 shows an exemplary detailed embodiment of a quadrature CMOS passive transmit mixer and impedance transformer.

FIG. 7 shows an exemplary detailed embodiment of a quadrature CMOS passive transmit mixer 702 and impedance transformer 704. For example, the mixer 702 and impedance transformer 704 are suitable for use as the mixer 204 and impedance transformer 206 shown in FIG. 2. In this exemplary embodiment, the mixer 702 provides a differential output.

The impedance transformer 704 comprises input terminals 706 that receive a differential output of the passive mixer 702. The impedance transformer 704 is coupled to an output port 708 that produces output signals that are input to downstream components of a transmitter chain, for example, the downstream component 208 shown in FIG. 2.

In an exemplary embodiment, the impedance transformer 704 comprises a first capacitor (C1), an inductor (L1) and a second capacitor (C2) connected in series across the input terminals 706. A capacitor C3 is connected to a first terminal of the inductor L1, and a capacitor C4 is connected to a second terminal of the inductor L1. The output port 708 is provided between the secondary terminals of capacitors C3 and C4.

Thus, in this embodiment, the impedance transformer 704 comprises a series C-L-C configuration. The impedance transformer 704 operates to set the complex impedance presented to the RF side of the mixer 702 to increase or generate a selected level of reverse isolation and reduce or eliminate the availability of stored energy that may flow back through the mixer 702 to the baseband side. By setting the selected level of reverse isolation of the mixer 702, a selected amplitude flatness symmetry characteristic across a selected transmission band can be achieved. In an exemplary alternate embodiment, the capacitor C2 is omitted and replaced with a short circuit.

Figure 8:
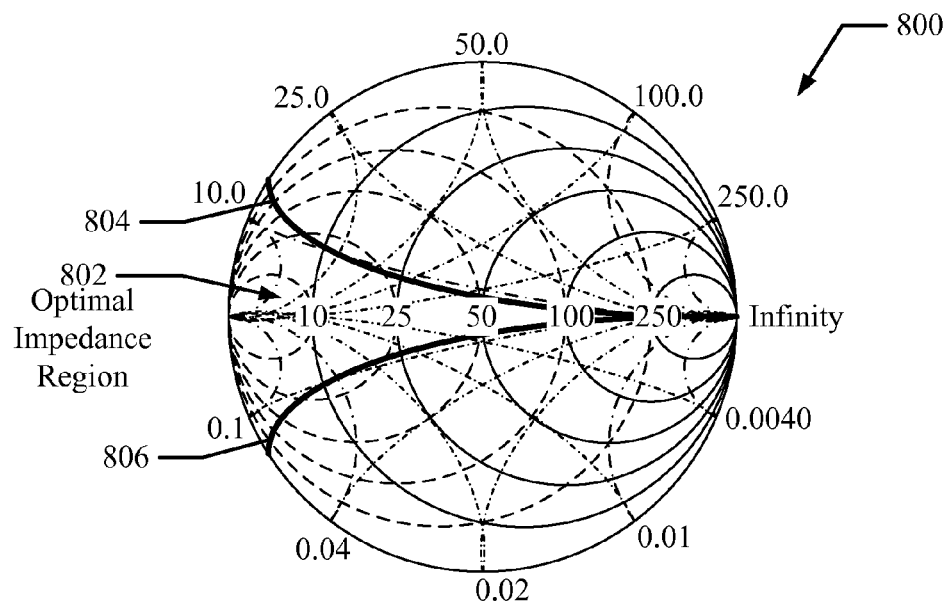
FIG. 8 shows an exemplary Smith chart that illustrates a range of complex impedances provided by an impedance transformer to generate a selected amount of reverse isolation for a quadrature CMOS passive mixer.

FIG. 8 shows an exemplary Smith chart 800 that illustrates an optimal range of complex impedances that can be provided by the impedance transformer 206 to increase the reverse isolation of a quadrature CMOS passive mixer. The Smith chart 800 represents the real impedance in the horizontal direction (equator) and the imaginary impedance in the vertical direction. As disclosed above, the impedance transformer 206 is set to reduce or eliminate energy storage at the RF side of the mixer so that RF signal energy stored during a first LO clock phase does not flow back through the mixer during an adjacent subsequent LO clock phase. For example, if less RF signal energy is stored, then less energy can flow back through the mixer to the baseband port. To accomplish this, the imaginary impedance component of the impedance ($Z_{RF}$) provided by the impedance transformer is set to be within the cone shaped region 802 shown on the Smith chart 800. The region 802 is defined by lines 804, 806, which represent constant reactance. The line 804 above the equator of the chart represents the positive reactance and the line 806 below the equator represents negative reactance. The closer the lines are to the equator the lower the reactance. Thus, the reactance is equal to the imaginary component of $Z_{RF}$.

Based on the frequency range of operation of the quadrature CMOS passive mixer, an impedance value for $Z_{RF}$ selected from within the region 802 will increase or generate a selected level of reverse isolation for the mixer. In an exemplary embodiment, the value of the imaginary component of $Z_{RF}$ is chosen to be within the region 802 to generate a selected amplitude flatness symmetry characteristic. Thus, the Smith chart 800 represents an example of a given optimal range to achieve level amplitude flatness symmetry. The closer the cone shape is to the equator of the Smith chart 800, the flatter the signal will be because the impedance becomes more real. However, using a complex impedance provides a desired amount of gain which eliminates the need for additional gain stages that degrade performance. For example, the region 802 defined by the lines 804 and 806 may represent 0.5 dB of flatness across 40 MHz, but to obtain a 20 MHz bandwidth and the same 0.5 dB flatness characteristic, the region would be larger but still having a similar shape. As an approximation, the same shape that is determined for a band flatness symmetry of 0.5 dB over 40 MHz equates to 0.25 dB over 20 MHz and 0.125 dB over 10 MHz. A more detailed description of the impedance selection for $Z_{RF}$ is provided below.

L-C-L Exemplary Embodiment

For the L-C-L embodiment of the impedance transformer shown in FIG. 6, the following equations can be utilized to determine the values for $Z_{RF}$ to increase mixer reverse isolation and generate a selected amplitude flatness symmetry characteristic.

$$Z_{RF} = \frac{1}{j*\omega*C1} + (j*\omega*L1) + (j*\omega*L2) + R_{series\_parasitic} \quad (1)$$

$$Z_{RF} = \frac{1(\omega^2*C1)*(L1+L2)}{j*\omega*C1} + R_{series\_parasitic} \quad (2)$$

$$Z_{RF} = Z_{RF\_real} + j*Z_{RF\_imaginery} \quad (3)$$

$$\omega_{LO} = \frac{1}{\sqrt{(L1+L2)*C1}} \quad (4)$$

$$Z_{RF\_real} = R_{series\_parasitic} \quad (5)$$

$$Z_{RF\_imaginery} = \frac{1-(\omega^2*C1)*(L1+L2)}{\omega*C1} \quad (6)$$

$$Z_{RF\_imaginery} = \frac{1}{\omega*C1} - \omega*(L1+L2) \quad (7)$$

Equations (1-7) above can be used to determine the real and imaginary components of $Z_{RF}$ at the resonant frequency ω, where $R_{series\_parasitic}$ is the series parasitic resistance of the impedance transformer.

C-L-C Exemplary Embodiment

For the C-L-C embodiment of the impedance transformer shown in FIG. 7, the following equations can be utilized to determine the values for $Z_{RF}$ to increase mixer reverse isolation and generate a selected amplitude flatness symmetry characteristic.

$$Z_{RF} = \frac{1}{j*\omega*C1} + \frac{1}{j*\omega*C2} + (j*\omega*L1) + R_{series\_parasitic} \quad (8)$$

$$Z_{RF} = \frac{C1+C2+(R_{series\_parasitic})(j*\omega*C1*C2)-(\omega^2*L1*C1*C2)}{j*\omega*C1*C2} \quad (9)$$

$$Z_{RF} = R_{series\_parasitic} + \frac{(j*\omega*L1*C1*C2)}{C1*C2} - \frac{j*(C1+C2)}{\omega*C1*C2} \quad (10)$$

$$Z_{RF} = Z_{RF\_real} + j*Z_{RF\_imaginery} \quad (11)$$

$$\omega_{LO} = \frac{1}{\sqrt{L1*\left(\frac{C1*C2}{C1+C2}\right)}} \quad (12)$$

$$Z_{RF\_real} = R_{series\_parasitic} \quad (13)$$

$$Z_{RF\_imaginery} = \frac{(\omega*L1*C1*C2)}{C1*C2} - \frac{(C1+C2)}{\omega*C1*C2} \quad (14)$$

Equations (8-14) above can be used to determine the real and imaginary components of $Z_{RF}$ at the resonant frequency ω, where $R_{series\_parasitic}$ is the series parasitic resistance of the impedance transformer.

Figure 9:
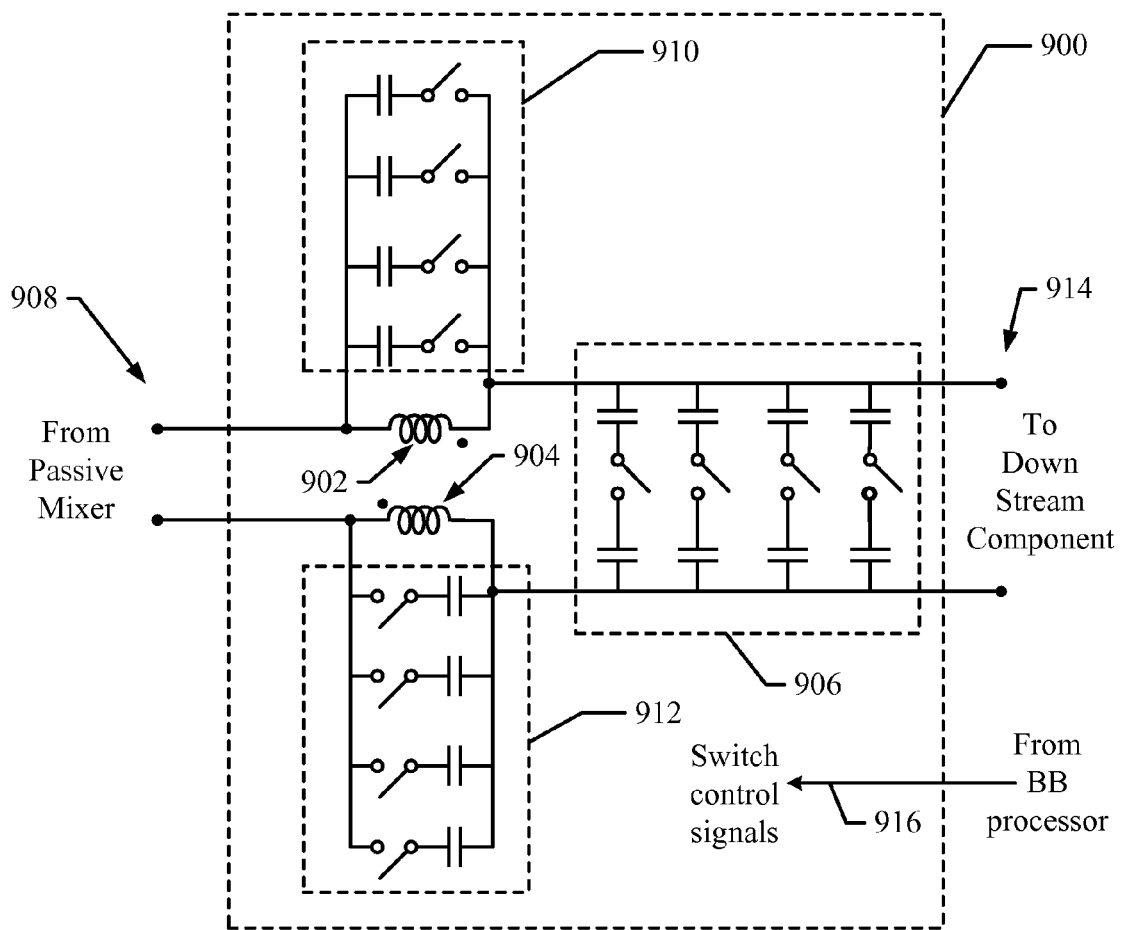
FIG. 9 shows another exemplary embodiment of an impedance transformer that provides frequency tuning and filtering.

FIG. 9 shows another exemplary embodiment of an impedance transformer 900. For example, the impedance transformer 900 is suitable for use as the impedance transformer 206 shown in FIG. 2.

The impedance transformer 900 comprises inductor 902, capacitor bank 906 and inductor 904 connected in series across input terminals 908. The capacitor bank 906 can generate a variable capacitance that can be set to tune the frequency of operation. The impedance transformer 900 also comprises capacitor banks 910 and 912 that can be set to capacitance values, which combine with the inductors 902, 904, respectively, to reject harmonics of the LO or RF signals. In an exemplary embodiment, a baseband processor or other entity at the device provides switch control signals 916 that are configured to open and/or close switches of the capacitor banks to set the appropriate capacitance values.

Figure 10:
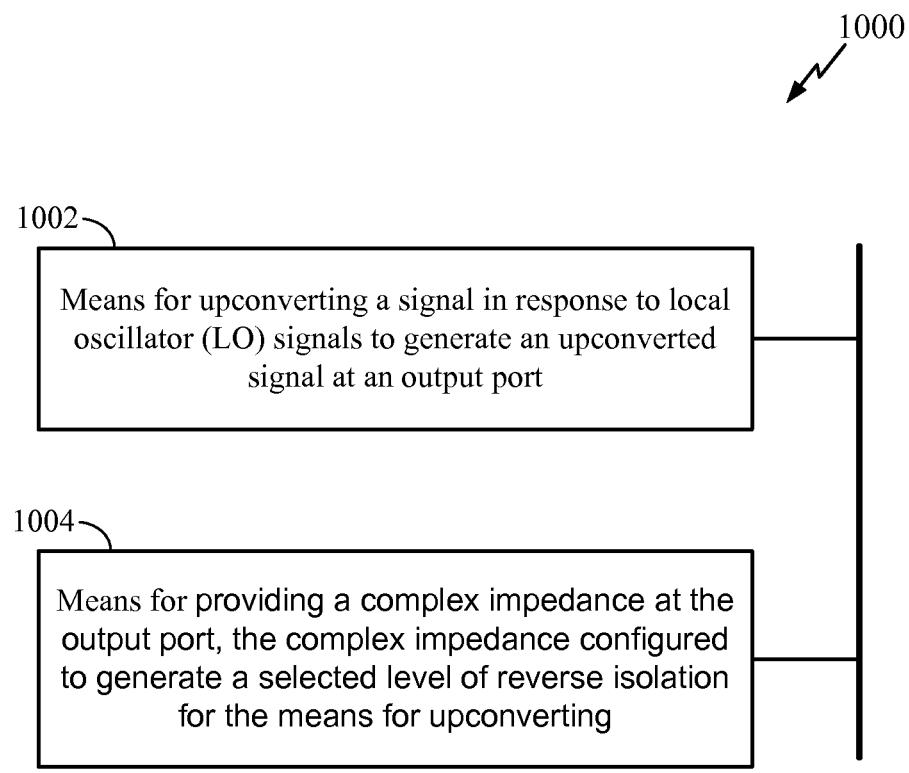
FIG. 10 shows an exemplary embodiment of an impedance transformer apparatus.

FIG. 10 shows an exemplary embodiment of an impedance transformer apparatus 1000. For example, the apparatus 1000 is suitable for use in the transmitter front end shown in FIG. 2. In an aspect, the apparatus 1000 is implemented by one or more modules configured to provide the functions as described herein. For example, in an aspect, each module comprises hardware and/or hardware executing software.

The apparatus 1000 comprises a first module comprising means (1002) for upconverting a signal in response to local oscillator (LO) signals to generate an up-converted signal at an output port, which in an aspect comprises the quadrature CMOS passive mixer 204.

The apparatus 1000 comprises a second module comprising means (1004) for providing a complex impedance at the output port, the complex impedance configured to generate a selected level of reverse isolation for the means for upconverting, which in an aspect comprises the impedance transformer 206.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   a mixer configured to receive a baseband signal from a baseband processor and to generate an up-converted signal at one or more mixer output ports in response to local oscillator (LO) signals; and
   an impedance transformer coupled to the mixer, the impedance transformer including inductive-capacitive circuitry and having multiple output terminals configured to generate a differential output signal applied to a device in a transmit chain, the impedance transformer including:
      a first inductor having a first terminal and a second terminal, the first terminal coupled to a first differential output port of the mixer; and
      a first capacitor and a second inductor connected in series between the second terminal and a second differential output port of the mixer.

2. The apparatus of claim 1, the mixer being configured as a passive mixer having complementary metal oxide semiconductor (CMOS) switches that conduct when enabled and that provide an open circuit when disabled.

3. The apparatus of claim 1, the LO signals including a first LO signal having a first phase, a second LO signal having a second phase, a third LO signal having a third phase, and a fourth LO signal having a fourth phase, the mixer including:
   a first set of switches configured to process an in-phase component of the baseband signal responsive to the first LO signal and the second LO signal; and
   a second set of switches configured to process a quadrature phase component of the baseband signal responsive to the third LO signal and the fourth LO signal.

4. The apparatus of claim 1, the inductive-capacitive circuitry configured to provide a complex impedance at the one or more mixer output ports to generate a selected level of reverse isolation for the mixer, and the inductive-capacitive circuitry comprising an imaginary impedance component configured to generate selected amplitude flatness symmetry for the up-converted signal over a selected frequency range.

5. The apparatus of claim 1, the inductive-capacitive circuitry comprising an imaginary impedance component to reduce storage of signal energy at the mixer output port during a first duration associated with a first LO signal to reduce an amount of the signal energy that flows from the mixer output port back through the mixer during a second duration associated with a second LO signal, the second LO signal being subsequent to the first LO signal.

6. The apparatus of claim 1, the second terminal of the first inductor being coupled to a first output terminal, a first terminal of the second inductor being coupled to the second differential output port of the mixer, and a second terminal of the second inductor being coupled to a second output terminal.

7. The apparatus of claim 1, wherein the up-converted signal comprises a radio frequency signal, and further comprising a direct conversion transmitter and a driver amplifier in the transmit chain, the direct conversion transmitter including the mixer and being configured to generate the up-converted signal via a direct conversion from the baseband signal to the radio frequency signal, and the driver amplifier configured to receive the radio frequency signal.

8. The apparatus of claim 1, the impedance transformer further comprising a set of input terminals configured to receive the up-converted signal, wherein a number of input terminals of the impedance transformer is the same as a number of output terminals of the impedance transformer.

9. The apparatus of claim 1, the mixer comprising:
 a first set of switches configured to process an in-phase component of the baseband signal; and
 a second set of switches configured to process a quadrature phase component of the baseband signal.

10. An apparatus comprising:
 means for upconverting a baseband signal in response to local oscillator (LO) signals to generate an up-converted signal at an output port, the baseband signal received from a baseband processor; and
 means for presenting an impedance at the output port, the means for presenting having multiple output terminals configured to generate a differential output signal applied to a device in a transmit chain, the means for presenting the impedance comprising:
  first means for storing energy having a first terminal and a second terminal, the first terminal coupled to a first differential output of the means for upconverting; and
  first means for storing charge and second means for storing energy connected in series between the second terminal and a second differential output of the means for upconverting.

11. The apparatus of claim 10, further comprising means for generating one or more switch control signals, the one or more switch control signals being configured to selectively enable one or more switches coupled to the means for presenting the impedance, the impedance including a complex impedance associated with a selected level of reverse isolation responsive to the one or more switches being selectively enabled.

12. The apparatus of claim 10, the second terminal being coupled to a first output terminal, the second means for storing energy coupled to the second differential output and coupled to a second output terminal, wherein the means for presenting the impedance further comprises:
 second means for storing charge of the second terminal of the first means for storing energy and coupled to the first output terminal; and
 third means for storing charge coupled to the second means for storing energy and coupled to the second output terminal.

13. A method comprising:
 up-converting, at a mixer, a baseband signal in response to local oscillator (LO) signals to generate an up-converted signal at one or more output ports of the mixer, the baseband signal received from a baseband processor at the mixer;
 applying a first differential output signal from the mixer to a first input terminal of an impedance transformer, the first input terminal coupled to a first terminal of a first inductor; and
 applying a second differential output signal from the mixer to a second input terminal of the impedance transformer, the impedance transformer including a capacitor and a second inductor connected in series between a second terminal of the first inductor and the second input terminal.

* * * * *